United States Patent
Rosenberg

(10) Patent No.: US 11,662,854 B2
(45) Date of Patent: *May 30, 2023

(54) METHOD OF ROUTING IN A SINGULAR DIRECTION FIRST TRACES THAT ARE ELECTRICALLY COUPLED TO RESPECTIVE ROWS OF AN ARRAY OF TOUCH SENSORS BETWEEN RESPECTIVE SECOND TRACES THAT ARE ELECTRICALLY COUPLED TO RESPECTIVE COLUMNS OF THE ARRAY

(71) Applicant: Sensel, Inc., Mountain View, CA (US)

(72) Inventor: Ilya Daniel Rosenberg, Mountain View, CA (US)

(73) Assignee: SENSEL, INC., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/484,853

(22) Filed: Sep. 24, 2021

(65) Prior Publication Data

US 2022/0011890 A1    Jan. 13, 2022

Related U.S. Application Data

(63) Continuation of application No. 16/733,190, filed on Jan. 2, 2020, now Pat. No. 11,132,077.
(Continued)

(51) Int. Cl.
*G06F 3/041* (2006.01)
*G02F 1/1343* (2006.01)
(Continued)

(52) U.S. Cl.
CPC ........ *G06F 3/04164* (2019.05); *G02F 1/1343* (2013.01); *H05K 1/115* (2013.01);
(Continued)

(58) Field of Classification Search
CPC ...... G06F 3/041; G06F 3/0443; G06F 3/0446; G06F 3/464; G06F 3/0412; G06F 3/044;
(Continued)

(56) References Cited

U.S. PATENT DOCUMENTS 6,147,680 A    11/2000  Tareev
6,188,391 B1    2/2001  Seely et al.
(Continued)

OTHER PUBLICATIONS

International Search Report and Written Opinion dated May 5, 2020 for PCT Application No. PCT/US20/12224, 11 pages.
(Continued)

*Primary Examiner* — Xuemei Zheng
(74) *Attorney, Agent, or Firm* — Amin, Turocy & Watson, LLP

(57) ABSTRACT

A method for improving flexibility of a circuit board, e.g., comprising a touch-based sensor, and reducing manufacturing costs by eliminating routing around a border of the touch-based sensor is presented herein. The method comprises forming an array of touch sensors on a first side of the circuit board, in which portions of the circuit board located between three edges of the circuit board and a border of the array of touch sensors exclude traces; and forming first traces between respective second traces in a singular direction on a second side of the circuit board, in which the first traces are electrically coupled, using a first group of vias, to respective rows of the array of touch sensors, and the second traces are electrically coupled, using a second group of vias, to respective columns of the array of touch sensors.

20 Claims, 19 Drawing Sheets

Related U.S. Application Data

(60) Provisional application No. 62/788,669, filed on Jan. 4, 2019.

(51) Int. Cl.
*H05K 1/11* (2006.01)
*H05K 1/18* (2006.01)
*H05K 3/30* (2006.01)
*H05K 1/03* (2006.01)

(52) U.S. Cl.
CPC ............. *H05K 1/117* (2013.01); *H05K 1/181* (2013.01); *H05K 3/30* (2013.01); *H05K 3/303* (2013.01); *G06F 3/041* (2013.01); *G06F 2203/04102* (2013.01); *G06F 2203/04103* (2013.01); *G06F 2203/04105* (2013.01); *H05K 1/0353* (2013.01); *H05K 2201/0154* (2013.01); *H05K 2201/10151* (2013.01)

(58) Field of Classification Search
CPC . G06F 2203/04103; G06F 2203/04111; G06F 3/04164; G02F 1/1343; G02F 1/134309; G02F 1/1333; H05K 1/115; H05K 1/117; H05K 1/181; H05K 3/30; H05K 3/303
See application file for complete search history.

(56) References Cited

U.S. PATENT DOCUMENTS

| | | | |
|---|---|---|---|
| 7,430,925 B2 | 10/2008 | Son et al. | |
| 8,373,664 B2 | 2/2013 | Wright | |
| 9,459,746 B2 | 10/2016 | Rosenberg et al. | |
| 9,465,477 B2 | 10/2016 | Rosenberg et al. | |
| 9,746,964 B2 | 8/2017 | Rosenberg et al. | |
| 9,864,460 B2 | 1/2018 | Rosenberg et al. | |
| 9,864,461 B2 | 1/2018 | Rosenberg et al. | |
| 9,939,972 B2 * | 4/2018 | Shepelev | G06F 3/0443 |
| 10,073,565 B2 | 9/2018 | Rosenberg et al. | |
| 10,088,947 B2 | 10/2018 | Rosenberg et al. | |
| 10,331,265 B2 | 6/2019 | Rosenberg et al. | |
| 10,488,996 B2 | 11/2019 | Rosenberg et al. | |
| 2013/0113752 A1 * | 5/2013 | Chang | G06F 3/0443 345/174 |
| 2014/0125403 A1 | 5/2014 | Yilmaz | |
| 2015/0091858 A1 | 4/2015 | Rosenberg et al. | |
| 2015/0212634 A1 * | 7/2015 | Pyun | H01L 27/1259 345/173 |
| 2018/0074357 A1 | 3/2018 | Chen et al. | |

OTHER PUBLICATIONS

Office Action dated Oct. 9, 2020 for U.S. Appl. No. 16/733,190, 29 pages.

* cited by examiner

1900

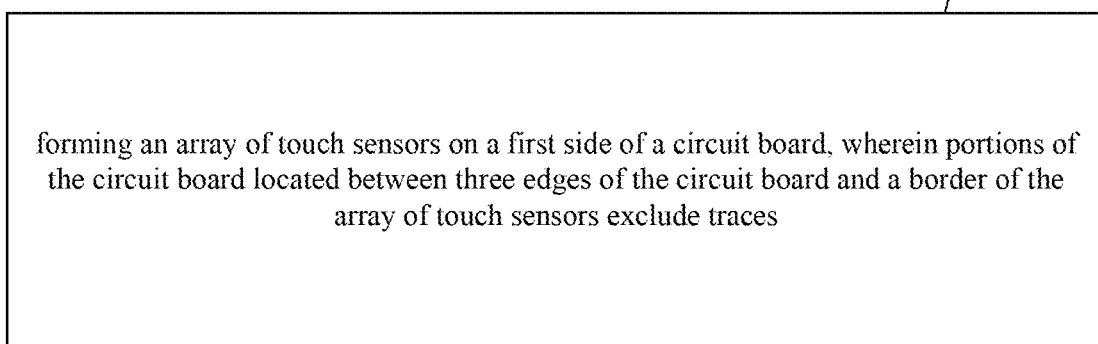

1910 forming an array of touch sensors on a first side of a circuit board, wherein portions of the circuit board located between three edges of the circuit board and a border of the array of touch sensors exclude traces

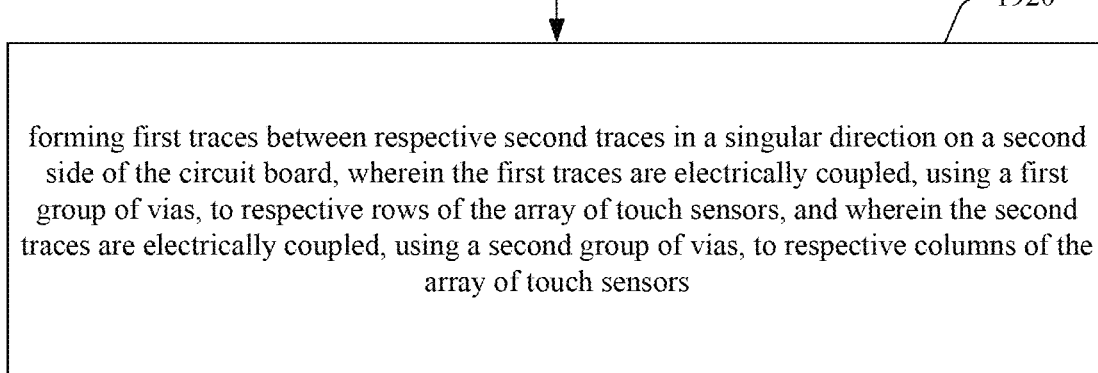

1920 forming first traces between respective second traces in a singular direction on a second side of the circuit board, wherein the first traces are electrically coupled, using a first group of vias, to respective rows of the array of touch sensors, and wherein the second traces are electrically coupled, using a second group of vias, to respective columns of the array of touch sensors

FIG. 19

METHOD OF ROUTING IN A SINGULAR DIRECTION FIRST TRACES THAT ARE ELECTRICALLY COUPLED TO RESPECTIVE ROWS OF AN ARRAY OF TOUCH SENSORS BETWEEN RESPECTIVE SECOND TRACES THAT ARE ELECTRICALLY COUPLED TO RESPECTIVE COLUMNS OF THE ARRAY

CROSS-REFERENCE TO RELATED APPLICATIONS

This patent application is a continuation of, and claims priority to, U.S. patent application Ser. No. 16/733,190, filed on Jan. 2, 2020, and entitled "METHOD OF ROUTING IN A SINGULAR DIRECTION FIRST TRACES THAT ARE ELECTRICALLY COUPLED TO RESPECTIVE ROWS OF AN ARRAY OF TOUCH SENSORS BETWEEN RESPECTIVE SECOND TRACES THAT ARE ELECTRICALLY COUPLED TO RESPECTIVE COLUMNS OF THE ARRAY", which claims priority to U.S. Provisional Patent Application No. 62/788,669, filed on Jan. 4, 2019, and entitled "METHOD OF ROUTING IN A SINGULAR DIRECTION FIRST TRACES THAT ARE ELECTRICALLY COUPLED TO RESPECTIVE ROWS OF AN ARRAY OF TOUCH SENSORS BETWEEN RESPECTIVE SECOND TRACES THAT ARE ELECTRICALLY COUPLED TO RESPECTIVE COLUMNS OF THE ARRAY", and is related to the following non-provisional patent applications: U.S. patent application Ser. No. 15/599,365 (now U.S. Pat. No. 10,488,996) titled SYSTEM FOR DETECTING AND CONFIRMING A TOUCH INPUT and filed on May 18, 2017; U.S. patent application Ser. No. 15/653,856 (now U.S. Pat. No. 10,073,565) titled TOUCH SENSOR DETECTOR SYSTEM AND METHOD and filed on Jul. 19, 2017; U.S. patent application Ser. No. 15/271,953 (now U.S. Pat. No. 9,746,964) titled DIAMOND PATTERNED TOUCH SENSOR SYSTEM AND METHOD and filed on Sep. 21, 2016; U.S. patent application Ser. No. 14/499,090 (now U.S. Pat. No. 9,459,746) titled CAPACITIVE TOUCH SENSOR SYSTEM AND METHOD and filed on Sep. 27, 2014; U.S. patent application Ser. No. 14/499,001 (now U.S. Pat. No. 9,465,477) titled RESISTIVE TOUCH SENSOR SYSTEM AND METHOD and filed on Sep. 26, 2014; U.S. patent application Ser. No. 15/224,003 (now U.S. Pat. No. 9,864,461) titled SYSTEMS AND METHODS FOR MANIPULATING A VIRTUAL ENVIRONMENT and filed on Jul. 29, 2016; U.S. patent application Ser. No. 15/223,968 (now U.S. Pat. No. 9,864,460) titled SYSTEMS AND METHODS FOR MANIPULATING A VIRTUAL ENVIRONMENT and filed on Jul. 29, 2016; U.S. patent application Ser. No. 15/470,669 (now U.S. Pat. No. 10,088,947) titled SYSTEM AND METHOD FOR DETECTING AND CHARACTERIZING FORCE INPUTS ON A SURFACE and filed on Mar. 27, 2017; and U.S. patent application Ser. No. 15/476,732 titled HUMAN-COMPUTER INTERFACE SYSTEM and filed on Oct. 5, 2017. The entireties of the aforementioned applications are hereby incorporated by reference herein.

TECHNICAL FIELD

The subject disclosure generally relates to embodiments for a method of routing, in a singular direction, first traces that are electrically coupled to respective rows of an array of touch sensors between respective second traces that are electrically coupled to respective columns of the array of touch sensors.

BACKGROUND

Conventional sensor routing techniques incorporate routing around borders of an active area of a touch sensor. Accordingly, the touch sensor has larger bezels and resists bending and/or flexing. Further, routing around the borders of the active area of the touch sensor increases manufacturing costs corresponding to fine trace-widths, reduced manufacturing yields, and reduced manufacturing panel utilization. Consequently, conventional sensor routing technologies have had some drawbacks, some of which are noted with reference to the various embodiments described herein below.

BRIEF DESCRIPTION OF THE DRAWINGS

Non-limiting embodiments of the subject disclosure are described with reference to the following figures, wherein like reference numerals refer to like parts throughout the various views unless otherwise specified:

FIG. 19 illustrates a method of manufacturing a circuit board, the circuit board comprising: a first side, top layer, etc. comprising an array of touch sensors in which portions of the circuit board located between three edges of the circuit board and a border of the array of touch sensors exclude traces; and a second side, bottom layer, etc. comprising first traces routed between respective second traces in a singular direction and electrically coupled, using a first group of vias, to respective rows of the array of touch sensors, and the respective second traces being electrically coupled, using a second group of vias, to respective columns of the array of touch sensors, in accordance with various example embodiments.

DETAILED DESCRIPTION

Figure 1:
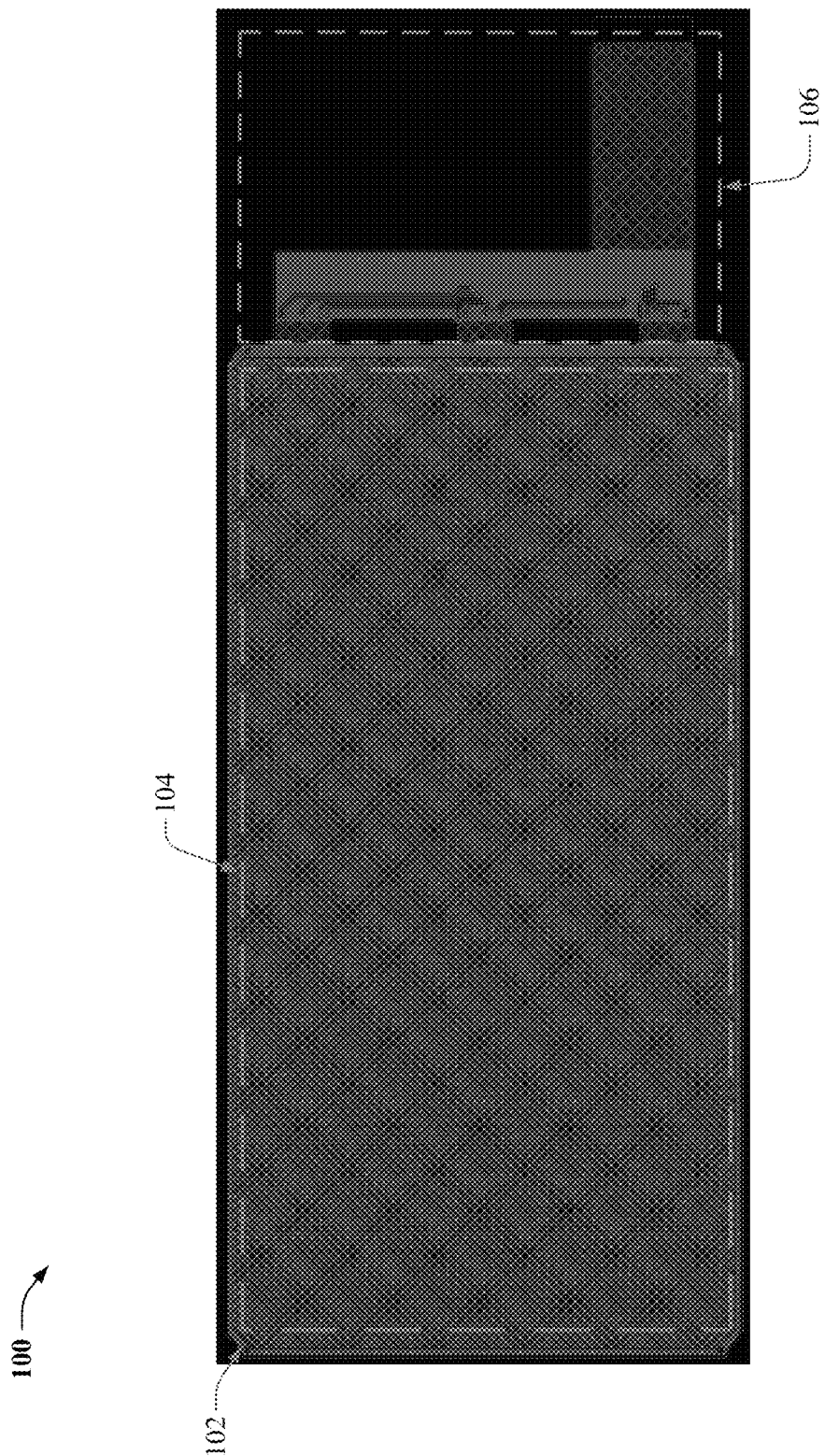
FIGS. 1 and 2 illustrate a top layer, first side, etc. of a printed circuit board (PCB) comprising an array of touch sensors extending almost to borders of the PCB without traces being routed around edges of the array of touch sensors, in accordance with various example embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

Various embodiments disclosed herein can improve flexibility of circuit boards, e.g., comprising touch-based sensors, and reduce manufacturing costs by eliminating routing around a border of, e.g., a touch-based sensor.

For example, in embodiment(s), a two-layer PCB can comprise, on a first side, top layer, etc. of the two-layer PCB, a tactile sensor, e.g., comprising an array of touch sensors, force-based sensors, capacitive sensors, etc., e.g., a variable impedance array (VIA) of sensors comprising variable impedance elements that interconnect with respective row and column cross points of the VIA of sensors, with traces, electrical routing, etc. being absent, excluded, etc. between three edges of the two-layer PCB and a border of the VIA of sensors.

Further, the two-layer PCB can comprise first traces routed between respective second traces on a second side, bottom layer, etc. of the two-layer PCB in a singular direction—the first traces being electrically coupled, e.g., using a first group of vias, to respective rows of the array of touch sensors, and the respective second traces being electrically coupled, e.g., using a second group of vias, to respective columns of the array of touch sensors.

In one embodiment, resistors, embedded resistors, etc. can be connected between respective traces of the first traces and/or the respective second traces.

In another embodiment, SMT resistors can be included in a tail portion of the two-layer PCB and be connected to respective traces of the first traces and/or the respective second traces, e.g., the tail portion comprising pins extending from, and being electrically coupled to, a portion of the first traces and/or the respective second traces to facilitate the PCB being connected, and the pins being electrically coupled, to a connector, an external connector, etc.

In another embodiment, a method, e.g., of manufacture of a circuit board, PCB, etc. can comprise forming an array of touch sensors, e.g., force-based sensors, a VIA of sensors, etc. on a first side, top layer, etc. of the circuit board, PCB, etc., in which portions of the circuit board, PCB, etc. that are located between three edges of the circuit board, PCB, etc. and a border of the array of touch sensors exclude traces.

Further, the method can comprise forming first traces between respective second traces in a singular direction on a second side, bottom layer, etc. of the circuit board, PCB, etc.—the first traces being electrically coupled, using a first group of vias, to respective rows of the array of touch sensors, and the respective second traces being electrically coupled, using a second group of vias, to respective columns of the array of touch sensors.

In yet another embodiment, the method can comprise embedding resistors between respective traces of the first traces and/or the respective second traces.

In an embodiment, the method can comprise electrically connecting surface mount (SMT) resistors of a tail portion of the circuit board, PCB, etc. to respective traces of the first traces and/or the respective second traces, e.g., the tail portion comprising pins extending from, and being electrically connected to, at least a portion of the first traces and/or the respective second traces to facilitate the circuit board, PCB, etc. being connected, and the pins being electrically coupled, to a connector, an external connector, etc.

Figure 2:
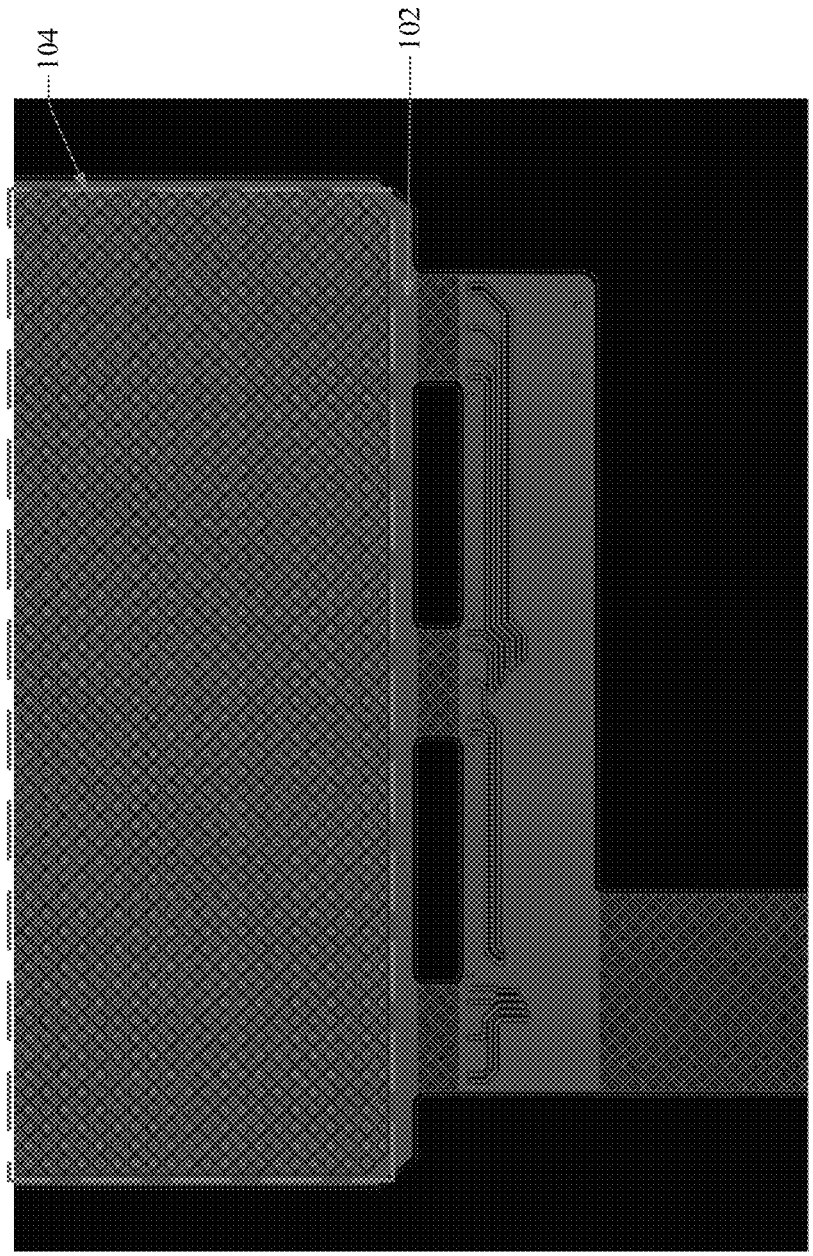

Now referring to FIGS. 1 and 2, a top, first, etc. layer of a PCB (102) comprising an array (104) of touch sensors (e.g., comprising diamond pads, outlines, etc. of respective touch sensors) extending almost to borders of the PCB without traces being routed around edges of the array of touch sensors is illustrated, in accordance with various example embodiments. In this regard, in various embodiments described herein, the array of touch sensors can comprise a variable impedance array (VIA) of sensors, touch sensors, etc. as described in one or more of the following applications, the disclosures of which are hereby incorporated by reference in their entirety: U.S. patent application Ser. No. 15/599,365 (now U.S. Pat. No. 10,488,996) titled SYSTEM FOR DETECTING AND CONFIRMING A TOUCH INPUT and filed on May 18, 2017; U.S. patent application Ser. No. 15/653,856 (now U.S. Pat. No. 10,073,565) titled TOUCH SENSOR DETECTOR SYSTEM AND METHOD and filed on Jul. 19, 2017; U.S. patent application Ser. No. 15/271,953 (now U.S. Pat. No. 9,746,964) titled DIAMOND PATTERNED TOUCH SENSOR SYSTEM AND METHOD and filed on Sep. 21, 2016; U.S. patent application Ser. No. 14/499,090 (now U.S. Pat. No. 9,459,746) titled CAPACITIVE TOUCH SENSOR SYSTEM AND METHOD and filed on Sep. 27, 2014; U.S. patent application Ser. No. 14/499,001 (now U.S. Pat. No. 9,465,477) titled RESISTIVE TOUCH SENSOR SYSTEM AND METHOD and filed on Sep. 26, 2014; U.S. patent application Ser. No. 15/224,003 (now U.S. Pat. No. 9,864,461) titled SYSTEMS AND METHODS FOR MANIPULATING A VIRTUAL ENVIRONMENT and filed on Jul. 29, 2016; U.S. patent application Ser. No. 15/223,968 (now U.S. Pat. No. 9,864,460) titled SYSTEMS AND METHODS FOR MANIPULATING A VIRTUAL ENVIRONMENT and filed on Jul. 29, 2016; U.S. patent application Ser. No. 15/470,669 titled SYSTEM AND METHOD FOR DETECTING AND CHARACTERIZING FORCE INPUTS ON A SURFACE and filed on Mar. 27, 2017; and U.S. patent application Ser. No. 15/476,732 titled HUMAN-COMPUTER INTERFACE SYSTEM and filed on Oct. 5, 2017.

In this regard, it should be noted that sensor(s) of the array of touch sensors of embodiment(s) described herein can be manufactured via various manufacturing processes and from various materials, e.g., comprising conductors that can be formed from copper, silver, carbon, silver nanowires, ITO, or other suitable materials via lamination, printing, sputtering, or other deposition methods. The conductors can be patterned by various subtractive processes (such as etching) or additive processes (such as screen printing or inkjet printing). The sensor(s) can be made on a substrate that is flexible (such as Kapton or PET), or on a rigid substrate (such as FR4 or glass); and can have additional conductive, dielectric or shielding layers as necessary for sensor operation.

Vias in embodiment(s) described herein can be mechanically drilled, laser drilled, punched, or created by openings in a printed dielectric. In this regard, corresponding electrodes can be manufactured on a side of a substrate, e.g., a dielectric can be printed on the side of the substrate, and a set of electrodes can be manufactured on top of the dielectric.

Resistors in embodiment(s) described herein can be embedded resistors, e.g., formed via a layer, e.g., a material such as Ohmega ply, a Nickel Chromium layer, a Nickel Phosphorous layer, etc. that is separate from another layer of a corresponding PCB, etc. In this regard, in embodiment(s), the embedded resistors can be printed, e.g., utilizing a thick-film carbon deposition, or can be surface mounted, e.g., on a tail portion of two-layer PCB(s) described herein.

Figure 3:
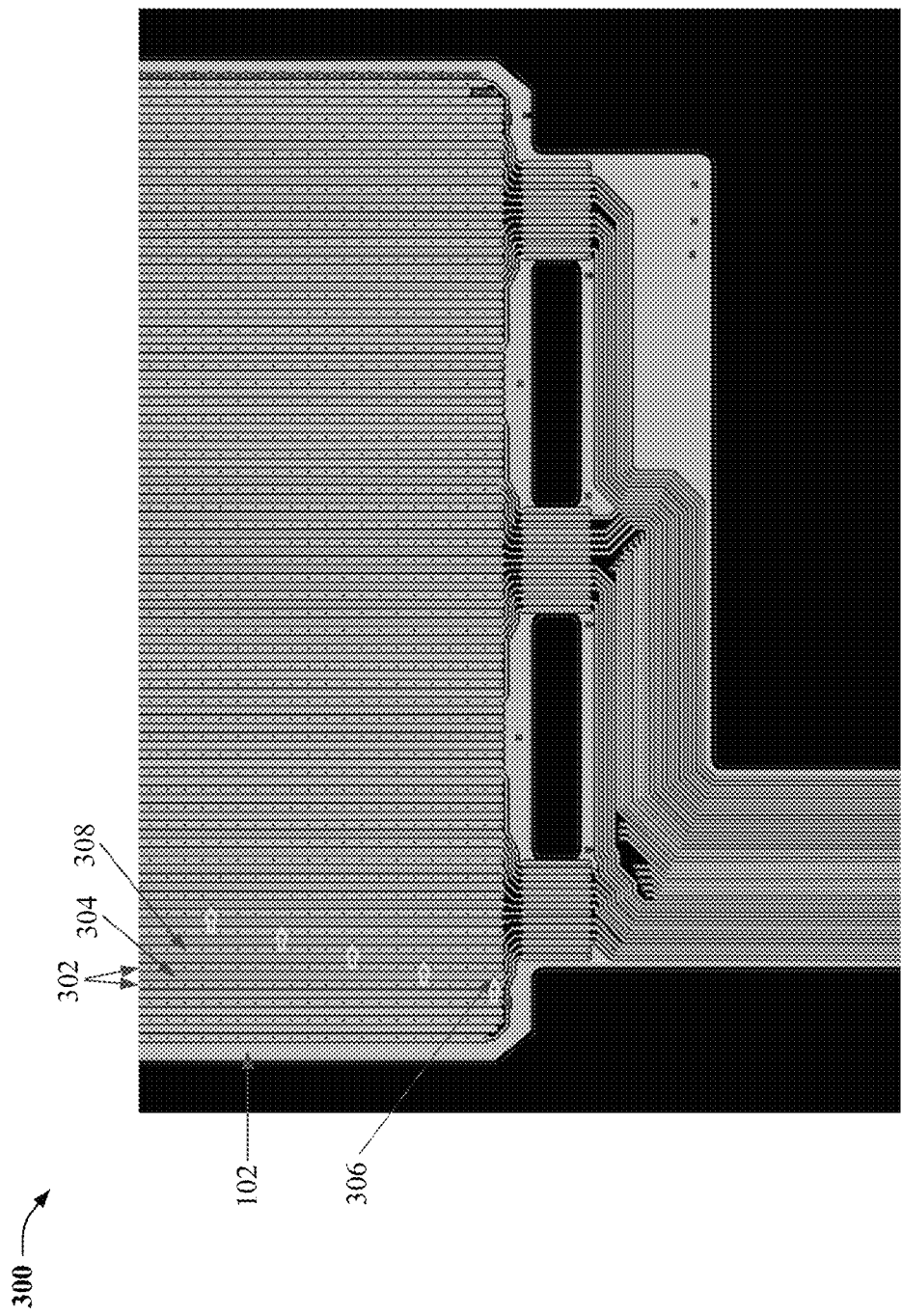
FIG. 3 illustrates a bottom layer, second side, etc. of the PCB comprising first traces routed between respective second traces in a singular direction, in which the first traces are electrically coupled to respective rows of the array of touch sensors located on the top layer, first side, etc. of the PCB, and the respective second traces are electrically coupled to respective columns of the array of touch sensors, in accordance with various example embodiments.
Figure 4:
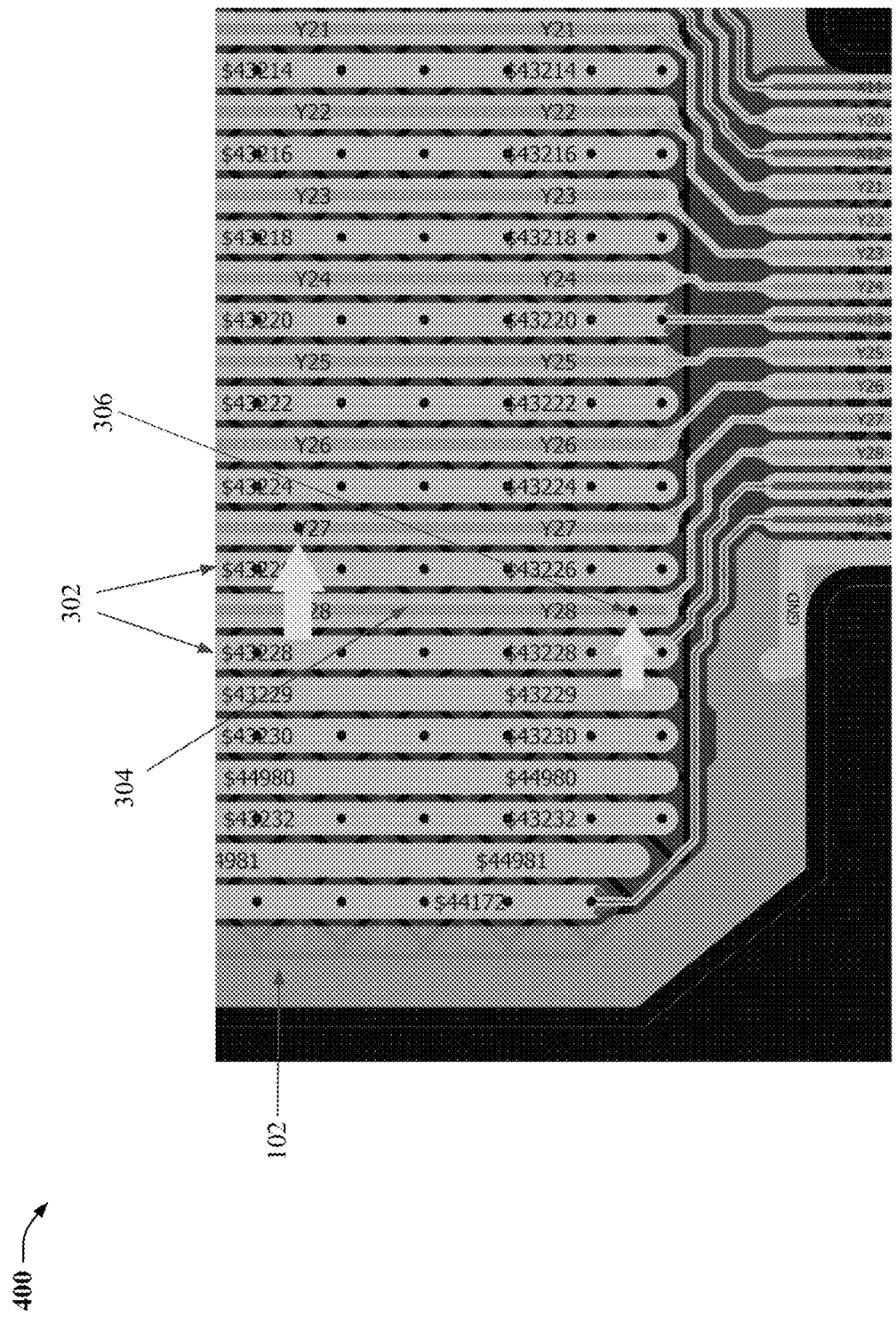
FIG. 4 illustrates a close up view of the bottom layer, second side, etc. of the PCB comprising the first traces routed between the respective second traces in the singular direction, in which the first traces are electrically coupled to the respective rows of the array of touch sensors located on the top layer, first side, etc. of the PCB utilizing a group of vias, and the respective second traces are electrically coupled to the respective columns of the array of touch sensors utilizing the group of vias, in accordance with various example embodiments.

As illustrated by FIGS. 3 and 4, a bottom, second, etc. layer of the PCB comprises first traces (e.g., green lines, 304, etc.) that are routed between respective second traces (e.g., blue lines, 302, etc.) in a singular direction. In this regard, the first traces are electrically coupled, utilizing vias (e.g., yellow arrows, 306, etc.) to respective rows of the array of touch sensors located on the top, first, etc. layer of the PCB. Further, the respective second traces are electrically coupled, utilizing vias (e.g., 308, etc.) to respective columns of the array of touch sensors. In embodiment(s), the vias are located, positioned, etc. in, near, etc. the center of, e.g., diamond pads, outlines, etc. of respective touch sensors of the array of touch sensors located on the top, first, etc. layer of the PCB.

Figure 5:
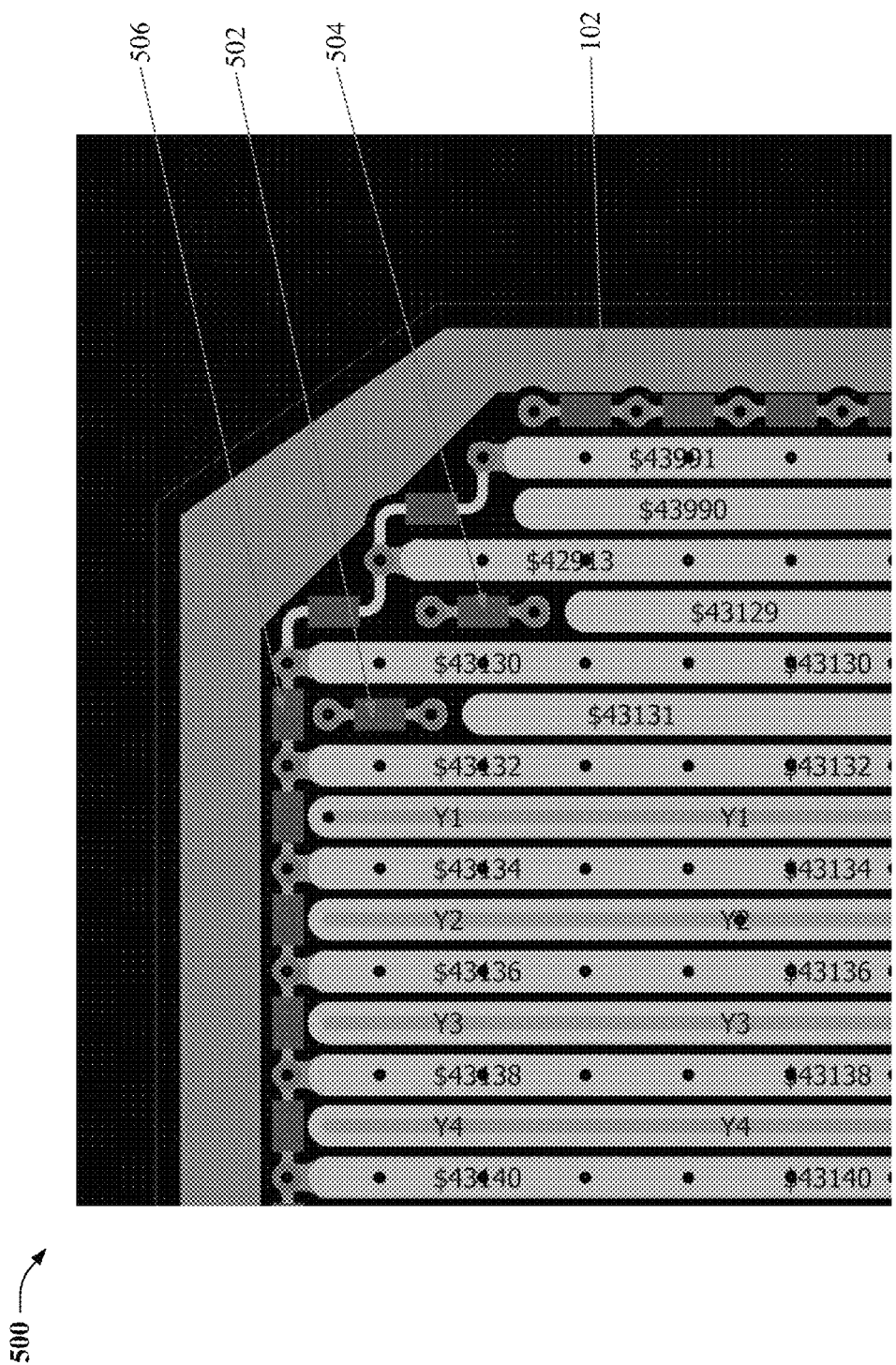
FIG. 5 illustrates a close up view of the bottom layer, second side, etc. of the PCB comprising resistors being embedded between the second traces, in accordance with various example embodiments.

In embodiment(s) illustrated by FIG. 5, the bottom, second, etc. layer of the PCB comprises resistors (e.g., 502, 504, 506, etc.) that are embedded between the second traces, electrically coupled between column traces, etc.

Figure 6:
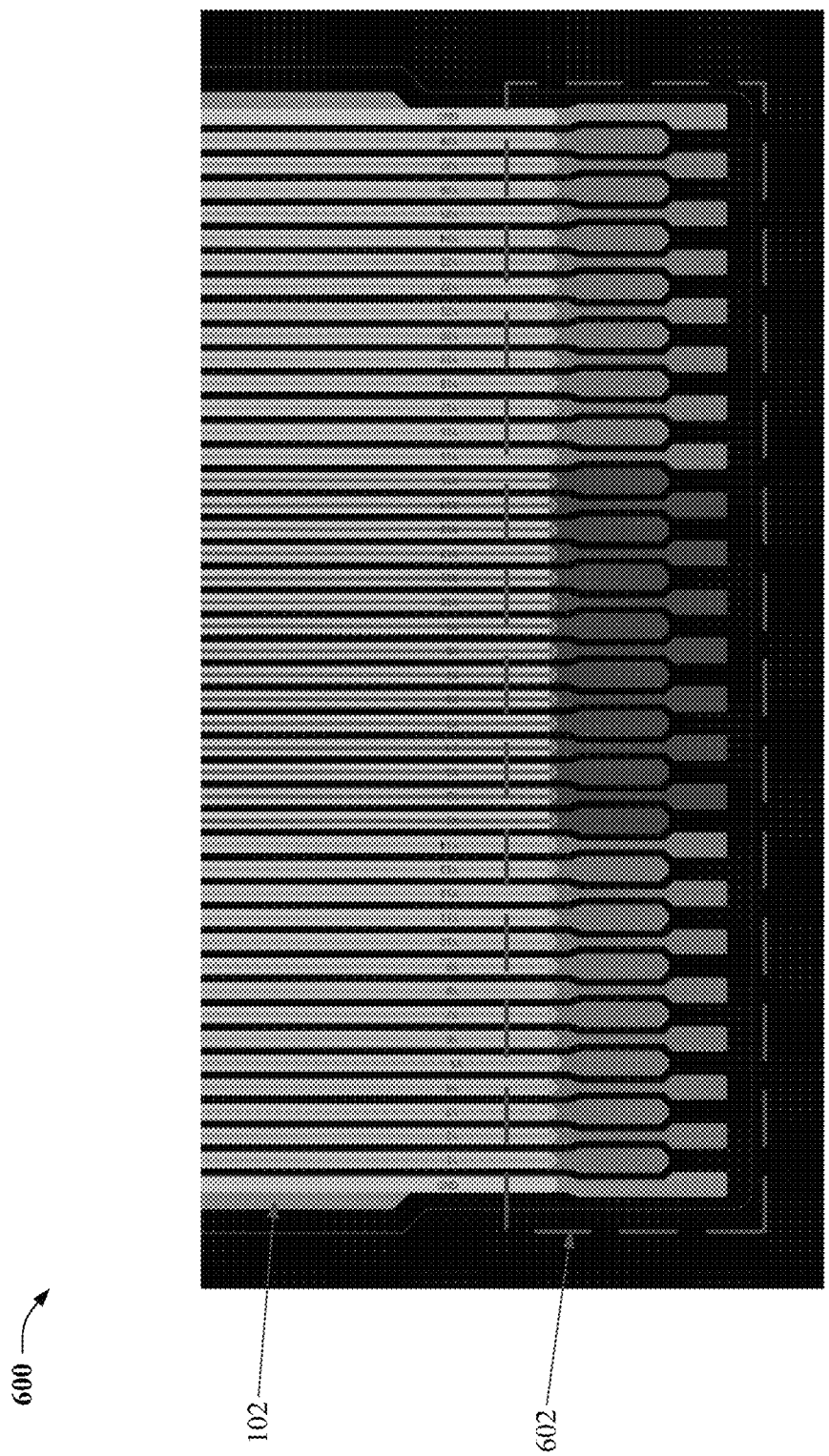
FIG. 6 illustrates a close up view of the bottom layer, second side, etc. of the PCB comprising pins extending from, being electrically coupled to, etc. at least a portion of the first traces and/or the second traces to facilitate the PCB being connected, and the pins being electrically coupled, to a connector, external connector, etc. in accordance with various example embodiments.

FIG. 6 illustrates a close up view of the bottom layer of the PCB comprising pins (602) extending from at least a portion of the first traces and the second traces. In embodiment(s), the pins can be arranged in a defined order for connecting, e.g., via a flex cable, to a corresponding connector (not shown).

In embodiment(s), the first traces can connect to every single row of the array of touch sensors or they can connect to just a subset of the rows of the array of touch sensors. Further, the respective second traces can connect to every single column of the array of touch sensors or they can connect to just a subset of the columns of the array of touch sensors. In embodiments in which the first traces connect to every single row of the array of touch sensors, resistors can be connected between pairs of the first traces to enable operation of a VIA of sensors.

In embodiments in which the respective second traces connect to every single column of the array of sensors, VIA of sensors, etc., resistors can be connected between pairs of the respective second traces to enable operation of the VIA of sensors.

In embodiments in which the first traces are not connected to every single row of the array of sensors, VIA of sensors, etc., resistors can be connected directly between the rows to enable operation of the array of sensors, VIA of sensors, etc.

In embodiments in which the respective second traces are not connected to every single column of the array of sensors, resistors can be connected directly between the columns to enable operation of the array of sensors, VIA of sensors, etc.

In embodiment(s), the first traces and the respective second traces can be routed just to one side of the PCB, or they can be routed to two sides of the PCB. For example, connections, e.g., to resistors, vias, etc. can be made both at the top layer, first side, etc. of a PCB comprising the array of sensors and a bottom layer, second side, etc. of the PCB—while keeping the array of sensors borderless, e.g., without traces, routings, etc. being placed, etc. on left and right sides of the PCB. Alternatively, the connections could be made at the left and right sides of the PCB—while keeping the array of sensors borderless, e.g., without traces, routings, etc. being placed, on top and bottom sides of the PCB.

It should be appreciated by a person of ordinary skill in the art of sensor device fabrication having the benefit of the instant disclosure that routing, in a singular direction, first traces on a first layer of a PCB (the first traces being electrically coupled to respective rows of an array of touch sensors that are located on a second layer of the PCB) between respective second traces of the first layer, which are electrically coupled to respective columns of the array of touch sensors that are located on the second layer of the PCB, results in, e.g., one or more of the following advantages over conventional sensor routing techniques:

1) Eliminate routing around a border corresponding to three out of four sides of a sensor/PCB and significantly reduce routing around a fourth side of the sensor/PCB;

2) Allow the sensor/PCB to bend and/or flex more easily without breaking, e.g., very suitable for foldable PCB applications, handle based (e.g., sports racket, golf club, bat, etc.) touch applications, designs, etc.;

3) Support a 1.25 mm or 1.0 mm pitch, active pitch, etc. between traces of a sensor, e.g., for stylus applications, without increasing a width of a border of the sensor (e.g., to route traces around the border);

4) Support placement of all sensor connections at only one edge of a corresponding PCB, e.g., corresponding to bond pads that can connect to a flex sensor;

5) Improve yields and lower manufacturing costs. e.g., by eliminating routing at edges of a sensor die; and/or 6) Lower manufacturing costs via use of a two-layer PCB—without routing at border(s) of a sensor of the PCB, e.g., such PCB suitable for use in a trackpad, display, morph sensor, etc.

Now referring to FIGS. 7-12, views of the PCB (102) in its entirety, and closeup views of an upper corner of the PCB are illustrated, respectively, in accordance with various example embodiments. In this regard, FIGS. 7-12 illustrate the bottom layer, first side, etc. of the entire PCB, a top layer of the entire PCB overlaid on the bottom layer, the top layer of the entire PCB, and closeup views of an upper corner of the PCB, respectively.

Figure 7:
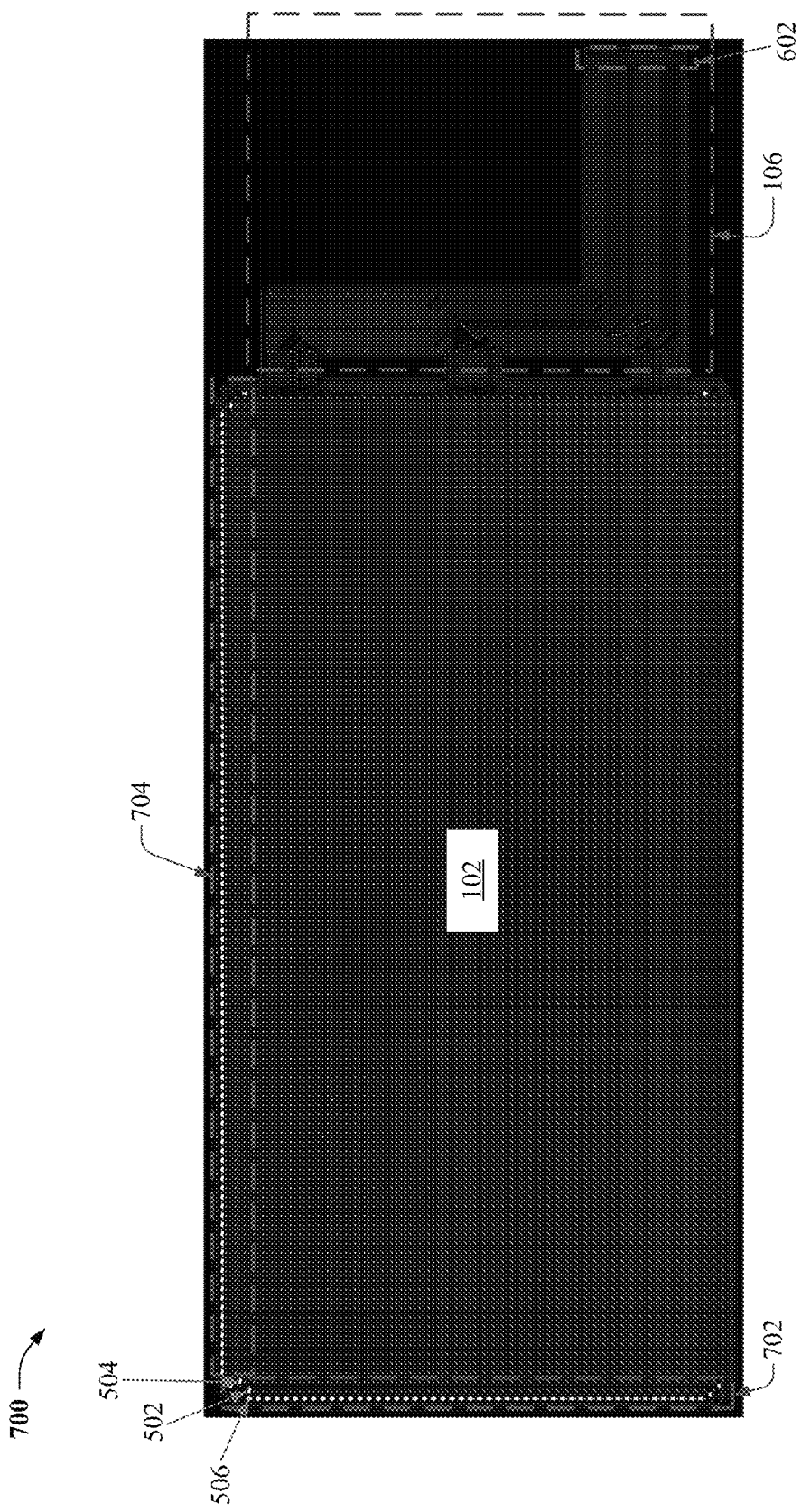
FIGS. 7-9 illustrate views of the PCB in its entirety, the PCB comprising: the top layer, first side, etc. comprising the array of touch sensors extending almost to borders of the PCB without traces being routed around edges of the array of touch sensors; the bottom layer, second side, etc. comprising the first traces routed between the respective second traces in the singular direction and electrically coupled to the respective rows of the array of touch sensors located on the top layer, first side, etc. of the PCB utilizing the group of vias, and the respective second traces electrically coupled to the respective columns of the array of touch sensors utilizing the group of vias; and the bottom layer, second side, etc. comprising resistors embedded between the respective second traces, in accordance with various example embodiments.
Figure 8:
Figure 9:
Figure 10:
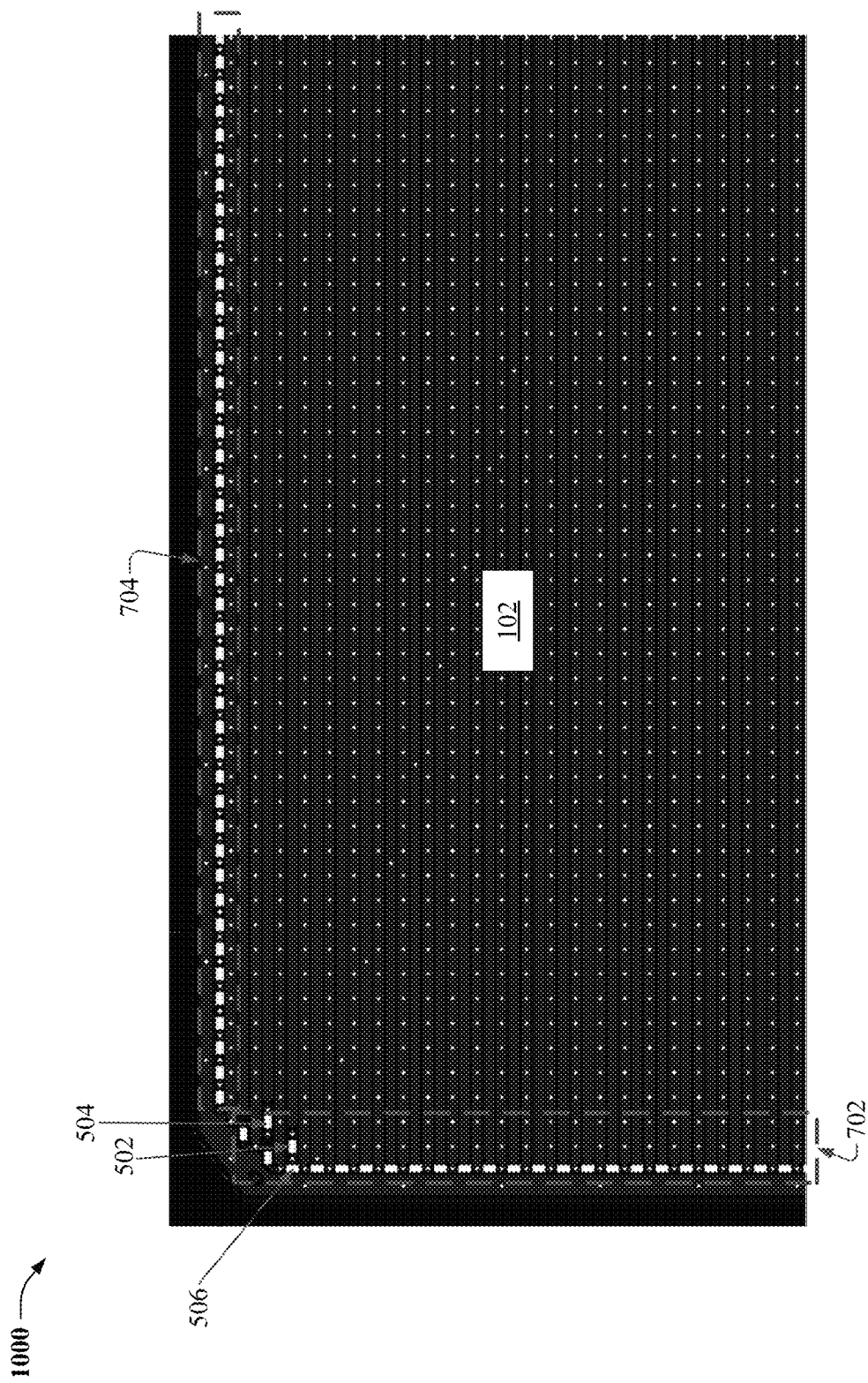
FIGS. 10-12 illustrate close up views of an upper corner of the PCB comprising: the array of touch sensors extending almost to borders of the PCB without traces being routed around edges of the array of touch sensors; the bottom layer, second side, etc. of the PCB comprising the first traces routed between the respective second traces in the singular direction and electrically coupled to the respective rows of the array of touch sensors located on the top layer, first side, etc. of the PCB utilizing the group of vias, and the respective second traces electrically coupled to the respective columns of the array of touch sensors utilizing the group of vias; and the bottom layer, second side, etc. comprising the resistors embedded between the respective second traces, in accordance with various example embodiments.
Figure 11:
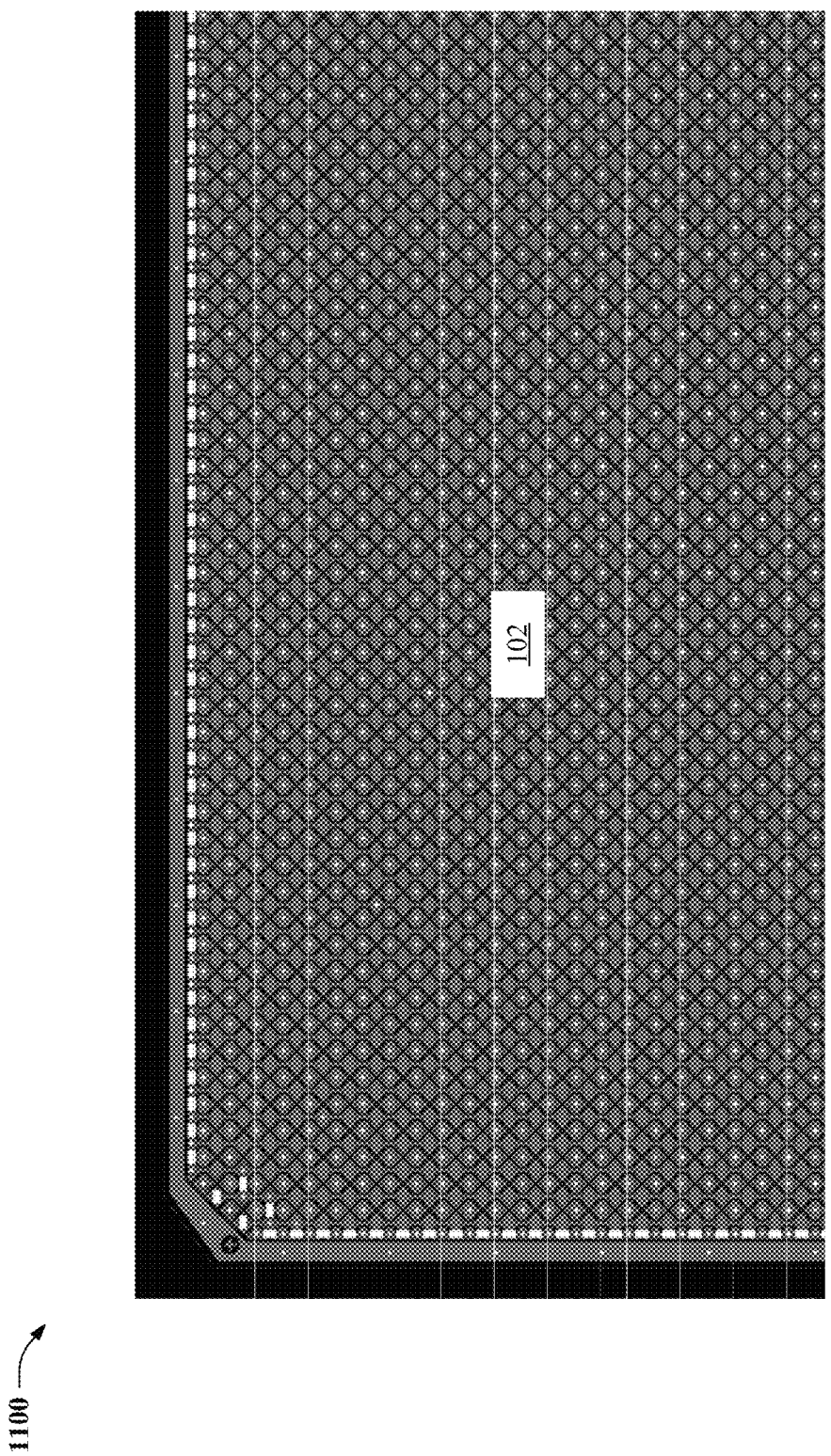
Figure 12:
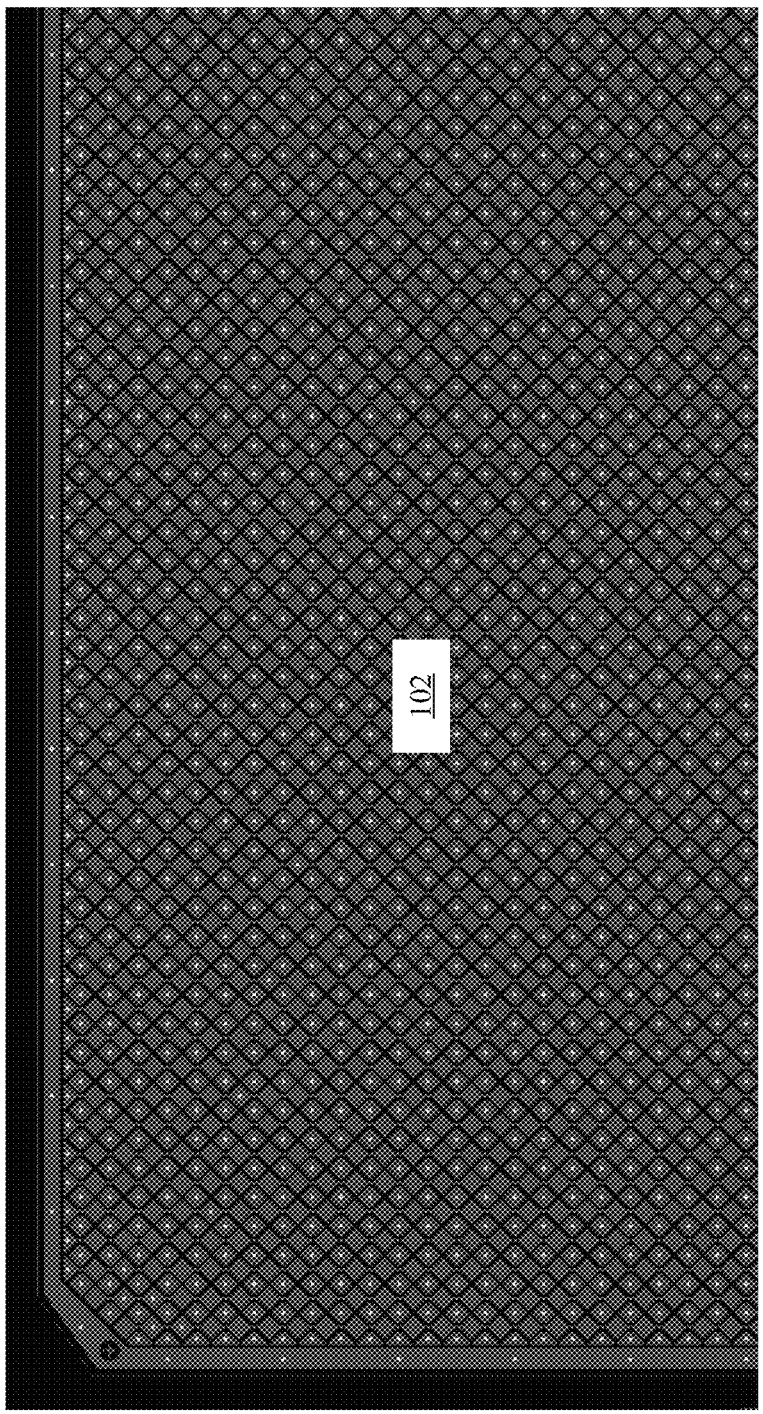

As illustrated by FIGS. 7 and 10, the bottom layer of the PCB comprises a first group (702) of embedded resistors (comprising resistors 502 and 504) and a second group of embedded resistors (704). In this regard, resistors 502 and 504 are placed, routed, etc. between respective second traces in a singular direction, and resistor 506 is electrically coupled to a pair of the respective second traces.

Now referring to FIGS. 13-18, views of a PCB (1302) in its entirety, and closeup views of a tail portion (1304) of the PCB are illustrated, respectively, in accordance with various example embodiments. In this regard, FIGS. 13-18 illustrate a bottom layer, second side, etc. of the entire PCB, a top layer, first side, etc. of the entire PCB overlaid on the bottom layer—the top layer comprising an array of touch sensors (104), and closeup views of the tail portion of the PCB, respectively.

Figure 13:
FIGS. 13-15 illustrate views of a PCB in its entirety, the PCB comprising: a top layer, first side, etc. comprising an array of touch sensors extending almost to borders of the PCB without traces being routed around edges of the array of touch sensors; a bottom layer, second side, etc. comprising first traces routed between respective second traces in a singular direction and electrically coupled to respective rows of the array of touch sensors located on the top layer, first side, etc. of the PCB utilizing a group of vias, and the respective second traces electrically coupled to respective columns of the array of touch sensors utilizing the group of vias; and the top layer, first side, etc. comprising, in a tail portion of the PCB, pins and surface mount (SMT) resistors, in accordance with various example embodiments.
Figure 14:

As illustrated by FIG. 13, the bottom layer, second side, etc. of the PCB comprises first traces that are routed between respective second traces in a singular direction. In this regard, the first traces are electrically coupled, utilizing vias, to respective rows of the array of touch sensors (e.g., 104) located on the top layer, first side, etc. of the PCB illustrated by FIG. 15. Further, the respective second traces are electrically coupled, utilizing vias, to respective columns of the array of touch sensors. In embodiment(s), the vias are located, positioned, etc. in, near, etc. the center of, e.g., diamond pads, outlines, etc. of respective touch sensors of the array of touch sensors located on the top layer of the PCB.

Figure 15:
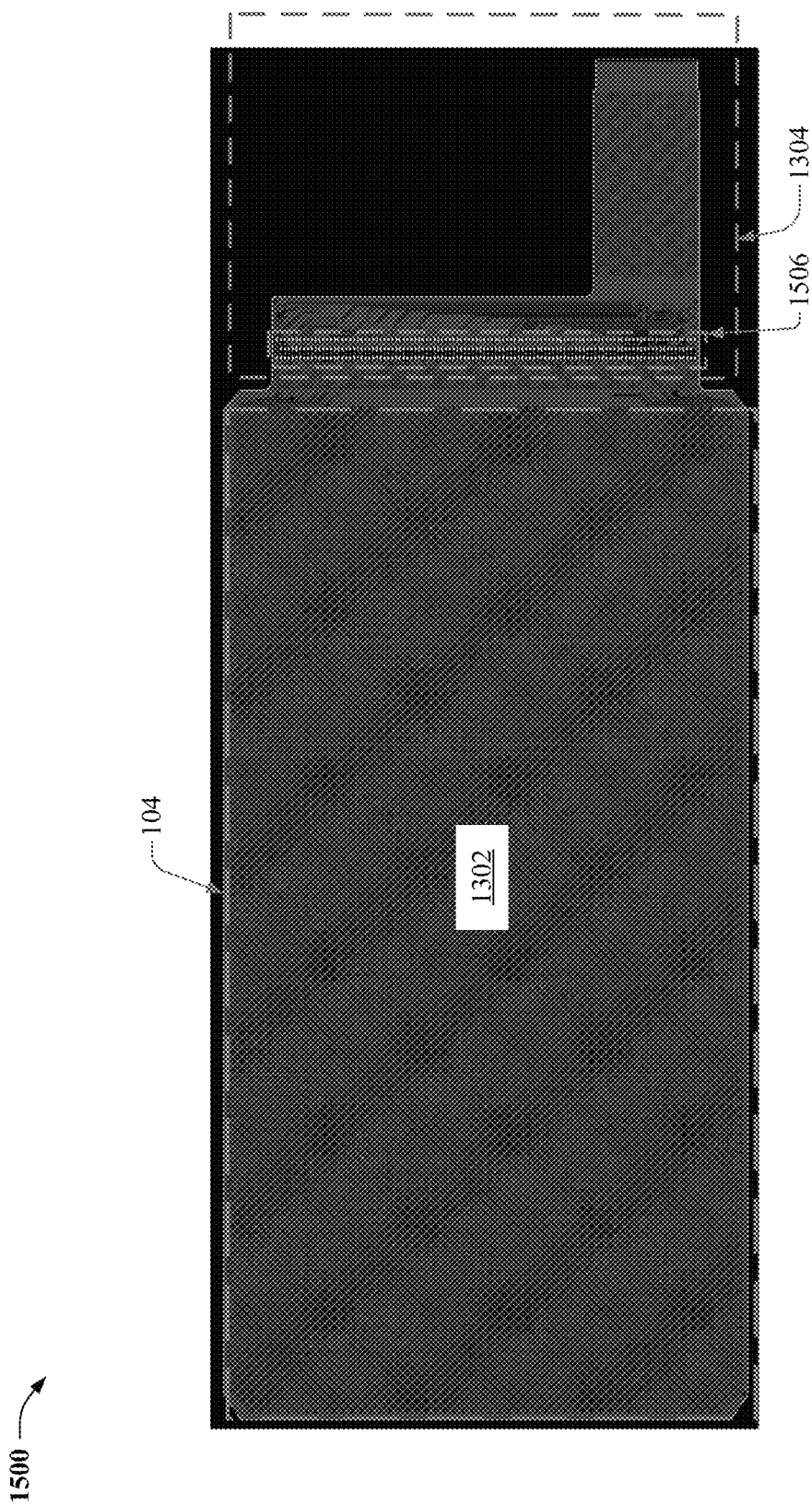
Figure 16:
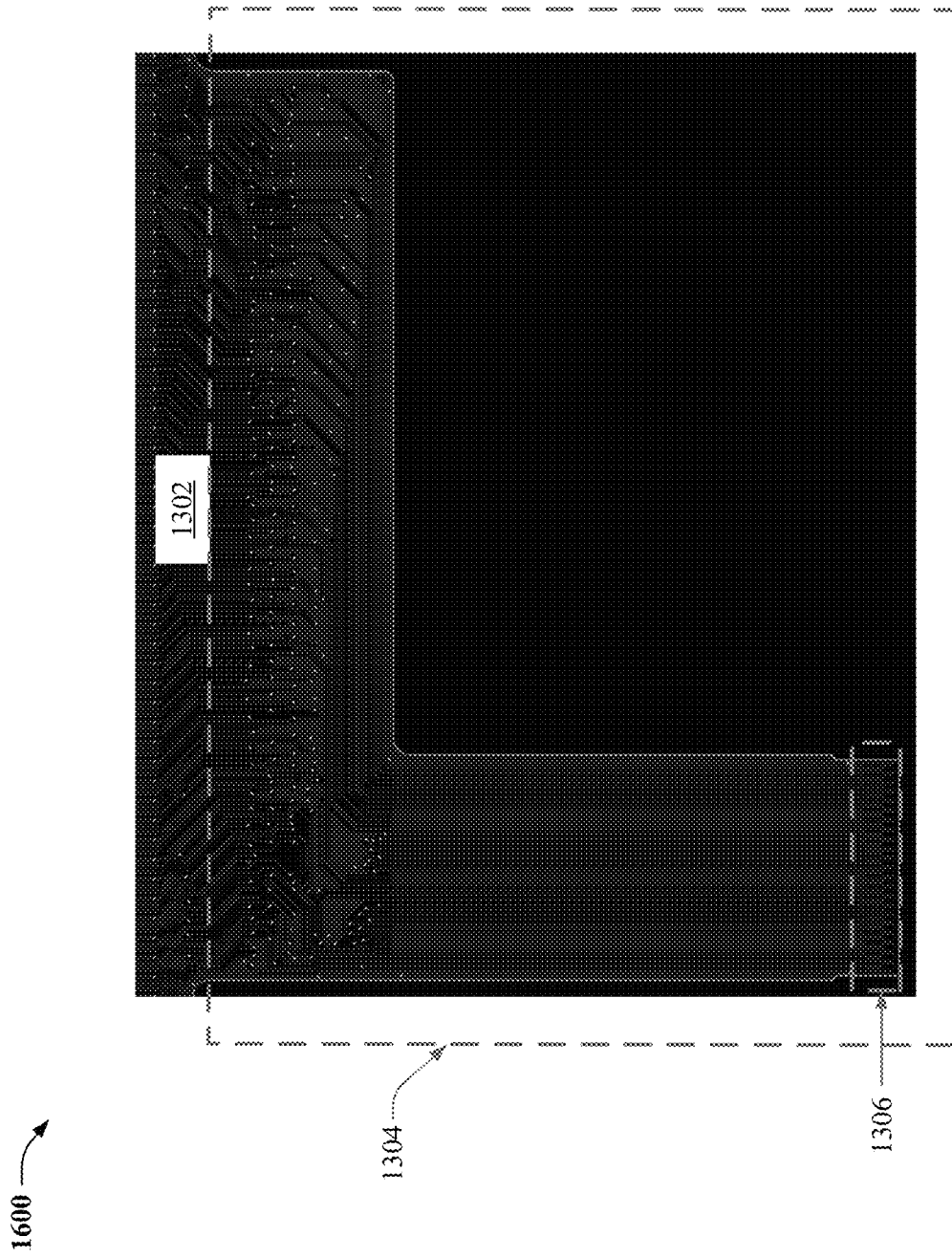
FIGS. 16-18 illustrate close up views of the tail portion of the PCB comprising the pins and the SMT resistors, the PCB comprising: the top layer, first side, etc. comprising the array of touch sensors extending almost to borders of the PCB without traces being routed around edges of the array of touch sensors; the bottom layer, second side, etc. comprising the first traces routed between the respective second traces in the singular direction and electrically coupled to the respective rows of the array of touch sensors located on the top layer first side, etc. of the PCB utilizing the group of vias, and the respective second traces electrically coupled to the respective columns of the array of touch sensors utilizing the group of vias, in accordance with various example embodiments.
Figure 17:
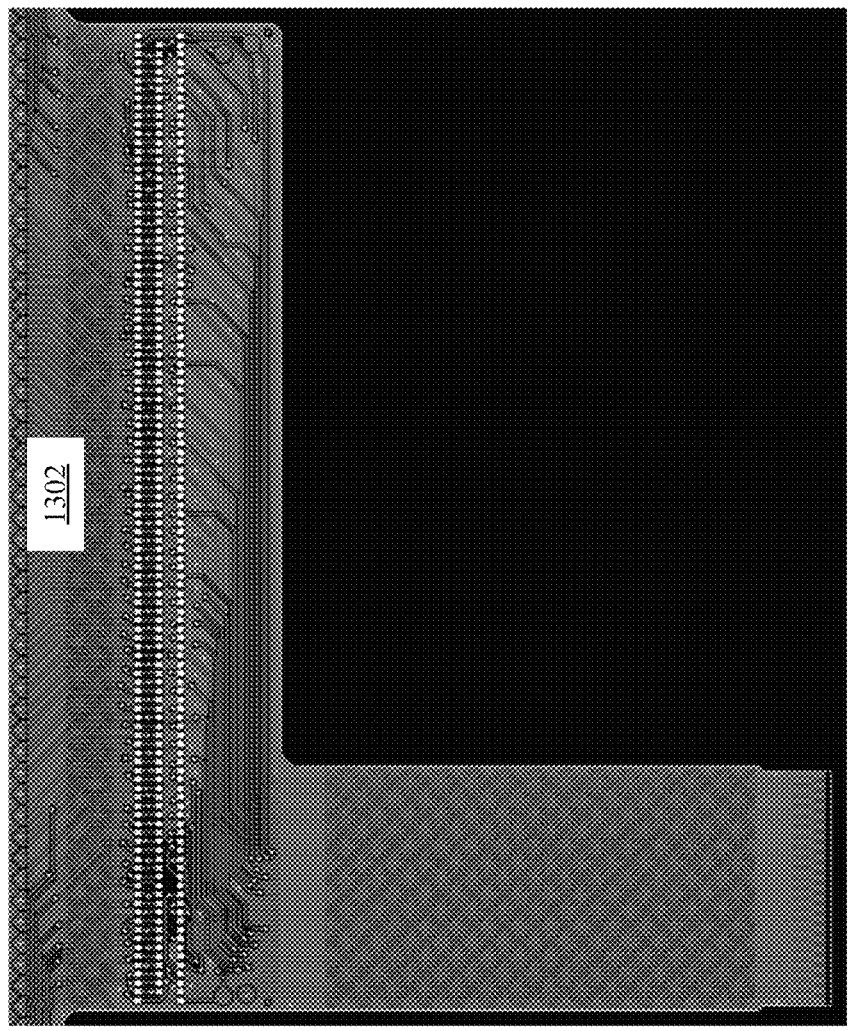
Figure 18:
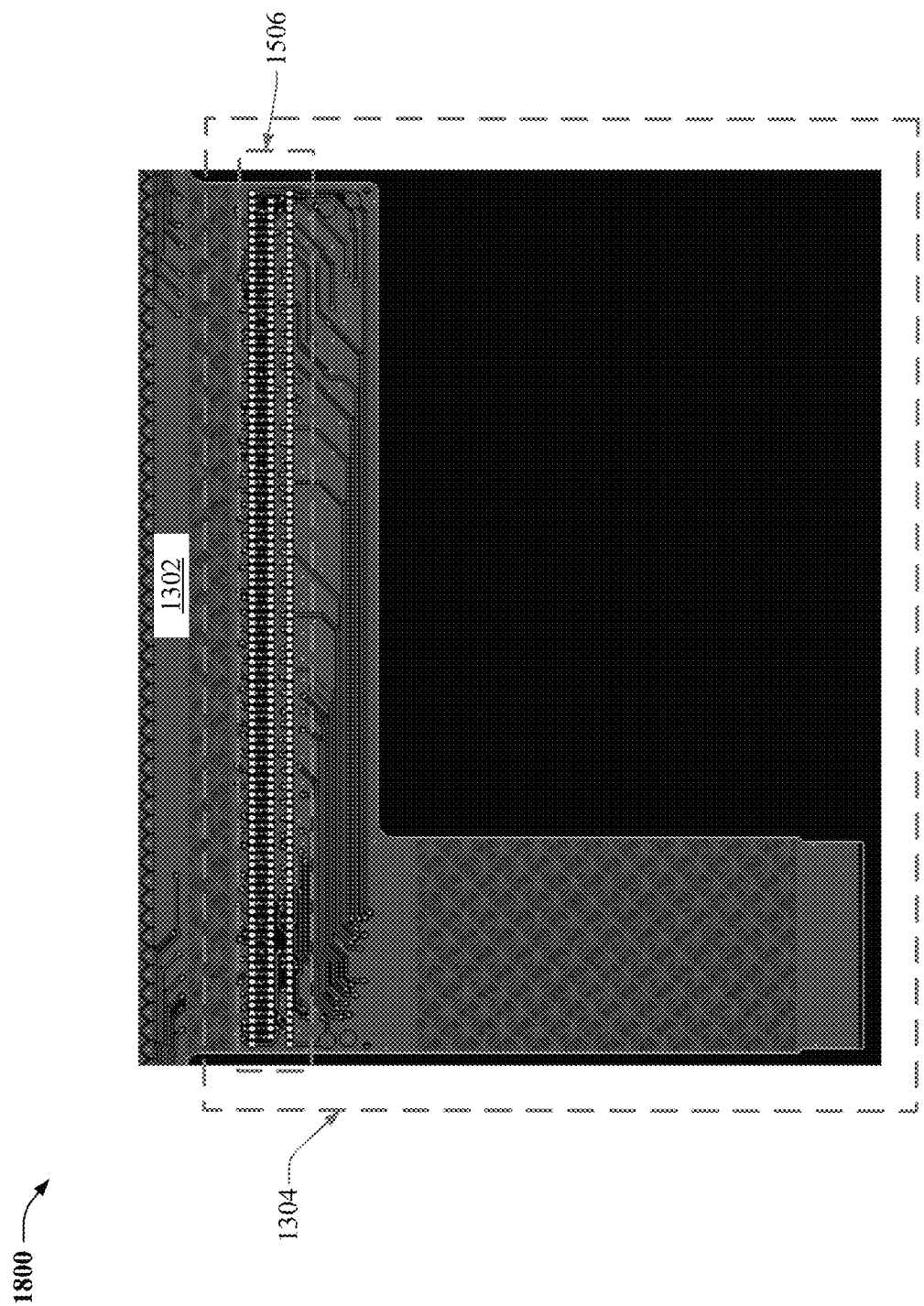

As illustrated by FIGS. 15 and 18, the tail portion (1304) of the top layer, first side, etc. of the PCB comprises SMT resistors (1506). In this regard, in embodiment(s), all row and column traces electrically coupled to the array of touch sensors are routed to the tail portion of the top layer, and electrically connected to the SMT resistors that are attached, placed, etc. in the tail portion. Such routing, placement, and use of the SMTs enables use of resistors of greater accuracy than embedded resistors, improves circuit reliability, and decreases circuit costs over embedded resistor designs.

In other embodiment(s) (not shown), the SMT resistors can be removed, and the row and column traces can be electrically connected, via the pins (1306) of the PCB, to a device, processor, processing component, chip, etc. (not shown) that can perform scanning, control, etc. of the array of touch sensors via the row and column traces, e.g., at a much higher resolution.

FIG. 19 illustrates a method of manufacturing a circuit board, PCB, etc. (e.g., 102, 1302, etc.), in accordance with various example embodiments. At 1910, an array of touch sensors can be formed on a first side of a circuit board, in which portions of the circuit board located between three edges of the circuit board and a border of the array of touch sensors exclude traces, routings, etc.

At 1920, first traces can be formed between respective second traces in a singular direction on a second side of the circuit board, in which the first traces are electrically coupled, using a first group of vias, to respective rows of the array of touch sensors, and the second traces are electrically coupled, using a second group of vias, to respective columns of the array of touch sensors.

In an embodiment (not shown), the method can comprise embedding resistors between respective traces of the first traces and/or the respective second traces.

In another embodiment (not shown), the method can comprise electrically connecting SMT resistors of the tail portion of the circuit board, PCB, etc. to respective traces of the first traces and/or the respective second traces, e.g., the tail portion comprising pins extending from, and being electrically connected to, at least a portion of the first traces and/or the respective second traces to facilitate the circuit board, PCB, etc. being connected, and the pins being electrically coupled, to a connector, an external connector, etc. (not shown).

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Aspects of components, logic, apparatus, devices, processes, and process blocks explained herein can be embodied within hardware, such as an ASIC or the like. Moreover, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

The above description of illustrated embodiments of the subject disclosure is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A method, comprising:
   forming an array of sensors on a first side of a circuit board; and
   alternately forming first traces between second traces in a singular direction on a second side of the circuit board, wherein the first traces are electrically coupled, using a first group of vias, to respective rows of the array of sensors, and wherein the second traces are electrically coupled, using a second group of vias, to respective columns of the array of sensors.

2. The method of claim 1, further comprising:
   embedding resistors between respective traces of the first traces.

3. The method of claim 2, wherein the embedding comprises:
   printing, via respective thick-film carbon depositions, the resistors between the respective traces of the first traces.

4. The method of claim 1, further comprising:
   embedding resistors between respective traces of the second traces.

5. The method of claim 4, wherein the embedding comprises:
   printing, via respective thick-film carbon depositions, the resistors between the respective traces of the second traces.

6. The method of claim 1, further comprising:
   attaching, to a tail portion of the circuit board, surface mount resistors; and
   electrically connecting the surface mount resistors to respective traces of at least one of the first traces or the second traces.

7. The method of claim 1, further comprising:
   printing, on a tail portion of the circuit board via a thick-film carbon deposition, resistors; and
   electrically connecting the resistors to respective traces of at least one of the first traces or the second traces.

8. The method of claim 1, wherein the forming of the first traces between the second traces comprises forming the first traces between the second traces based on a 1.0 mm pitch between the first traces and the second traces.

9. The method of claim 1, wherein the forming of the first traces between the second traces comprises forming the first traces between the second traces based on a 1.25 mm pitch between the first traces and the second traces.

10. A two-layer printed circuit board (PCB), comprising:
    an array of sensors that has been formed on a first side of the two-layer PCB; and
    first traces alternately routed between second traces on a second side of the two-layer PCB in a singular direction, wherein the first traces are electrically coupled to respective rows of the array of sensors, and wherein the second traces are electrically coupled to respective columns of the array of sensors.

11. The two-layer PCB of claim 10, wherein the sensors comprise force-based sensors.

12. The two-layer PCB of claim 10, wherein the sensors comprise a variable impedance array (VIA) of sensors comprising variable impedance elements that interconnect with respective row and column cross points of the VIA of sensors.

13. The two-layer PCB of claim 10, wherein the first traces are electrically coupled to the respective rows utilizing respective vias connecting the first traces to the respective rows.

14. The two-layer PCB of claim 10, wherein the second traces are electrically coupled to the respective columns utilizing respective vias connecting the second traces to the respective columns.

15. The two-layer PCB of claim 10, wherein resistors are connected between respective traces of the first traces.

16. The two-layer PCB of claim 10, wherein resistors are connected between respective traces of the second traces.

17. The two-layer PCB of claim 10, wherein surface mount resistors of a tail portion of the two-layer PCB are connected to respective traces of at least one of the first traces or the second traces.

18. The two-layer PCB of claim 10, wherein a tail portion of the two-layer PCB comprises pins that are connected to respective traces of at least one of the first traces or the second traces.

19. The two-layer PCB of claim 10, wherein the first side of the two-layer PCB comprises Kapton.

20. The two-layer PCB of claim 10, wherein the first side of the two-layer PCB comprises FR4.

* * * * *